(12) United States Patent
Hong

(10) Patent No.: US 7,902,899 B2
(45) Date of Patent: Mar. 8, 2011

(54) APPARATUS AND METHOD OF GENERATING REFERENCE CLOCK FOR DLL CIRCUIT

(75) Inventor: Nam-Pyo Hong, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/820,545

(22) Filed: Jun. 22, 2010

(65) Prior Publication Data

US 2010/0253407 A1 Oct. 7, 2010

Related U.S. Application Data

(63) Continuation of application No. 11/819,260, filed on Jun. 26, 2007, now Pat. No. 7,768,333.

(30) Foreign Application Priority Data

Aug. 11, 2006 (KR) .......................... 10-2006-0076219

(51) Int. Cl.
H03K 3/00 (2006.01)
(52) U.S. Cl. .......................... 327/294; 327/292; 327/298
(58) Field of Classification Search .......... 327/291–294, 327/298
See application file for complete search history.

(56) References Cited

U.S. PATENT DOCUMENTS

| 4,527,075 | A | 7/1985 | Zbinden |
| 5,059,818 | A | 10/1991 | Witt et al. |
| 6,750,689 | B2 | 6/2004 | Fletcher et al. |
| 6,813,197 | B2 | 11/2004 | Park |
| 6,853,225 | B2 | 2/2005 | Lee |
| 6,989,700 | B2 | 1/2006 | Kim |
| 7,023,254 | B2 | 4/2006 | Choi et al. |
| 7,103,133 | B2 | 9/2006 | Jung |
| 7,116,149 | B2 | 10/2006 | Kim |
| 7,154,311 | B2 | 12/2006 | Lim |
| 7,170,313 | B2 | 1/2007 | Shin |
| 7,202,722 | B2 | 4/2007 | Mahadevan et al. |
| 7,221,204 | B2 | 5/2007 | Kim et al. |
| 7,414,451 | B2 | 8/2008 | Lee |
| 7,548,100 | B2 * | 6/2009 | Cho et al. ...................... 327/175 |
| 7,619,454 | B2 | 11/2009 | Lee |
| 2004/0189363 | A1 | 9/2004 | Takano |
| 2006/0267649 | A1 | 11/2006 | Park et al. |

FOREIGN PATENT DOCUMENTS

| JP | 2000-068797 | 3/2000 |
| JP | 2005251370 | 9/2005 |
| KR | 10-1999-0081701 | 11/1999 |
| KR | 10-0299357 | 6/2001 |
| KR | 10-0525080 | 11/2005 |
| KR | 100738966 | 7/2007 |

\* cited by examiner

Primary Examiner — Lincoln Donovan
Assistant Examiner — William Hernandez
(74) Attorney, Agent, or Firm — Venable LLP; Jeffri A. Kaminski

(57) ABSTRACT

An apparatus for generating a reference clock for a DLL circuit includes a buffering unit configured to buffer an external clock so as to generate a first reference clock and a second reference clock, and to invert the second reference clock so as to generate a negative second reference clock. A duty cycle compensating unit generates a reference clock from the first reference clock and the negative second reference clock.

10 Claims, 2 Drawing Sheets

APPARATUS AND METHOD OF GENERATING REFERENCE CLOCK FOR DLL CIRCUIT

CROSS-REFERENCE TO RELATED PATENT APPLICATION

This application is a continuation of U.S. application Ser. No. 11/819,260 filed Jun. 26, 2007, which claims benefit of Korean Patent Application No. 10-2006-0076219, filed on Aug. 11, 2006, in the Korean Intellectual Property Office, the disclosure of which is incorporated herein in its entirety by reference.

BACKGROUND OF THE INVENTION

1. Technical Field

The present invention relates to an apparatus and method of generating a reference clock for a DLL (Delay Locked Loop) circuit, and more particularly, to an apparatus and method of generating a reference clock for a DLL circuit that generates a reference clock having a constant duty ratio even if the amount of power supply changes.

2. Related Art

In general, the DLL circuit is used to generate an internal clock whose phase leads a phase of a reference clock, which is obtained by converting an external clock. In a semiconductor integrated circuit, such as a synchronous DRAM (SDRAM), which has relatively high integration, the internal clock operates in synchronization with the external clock.

More specifically, the external clock is input to a clock buffer through an input pin of the semiconductor integrated circuit. The clock buffer outputs an internal clock. Then, the internal clock controls a data output buffer so as to output data. Here, the phase of the internal clock is delayed more than a phase of the external clock by a clock buffer. The internal clock having the delayed phase is further delayed by delay elements in the semiconductor integrated circuit and transmitted to the data output buffer.

Therefore, there occurs a problem in that output data is output after being delayed for an extended period of time as compared with the external clock. In other words, the time for which data is output after the external clock is applied, that is, output data access time is increased.

The DLL circuit may prevent an extension of the output data access time. The DLL circuit allows the phase of the internal clock to lead that of the external clock by a predetermined time. Therefore, output data is output without delay with respect to the external clock. That is, the DLL circuit receives the external clock and generates the internal clock whose phase leads a phase of the external clock.

The DLL circuit includes the clock buffer so as to generate a reference clock that is obtained by converting the amplitude of the external clock. Here, the generated reference clock is used to compare a phase thereof with a phase of a feedback clock by a phase comparator. Further, the reference clock is used as an input signal of a delay line that generates the internal clock under the control of a shift register.

Hereinafter, the operation of a DLL circuit according to the related art will be described with reference to the accompanying drawing.

FIG. 1 is a timing diagram illustrating the operation of an apparatus for generating a reference clock for a DLL circuit according to the related art.

In FIG. 1, a positive external clock clk_ext, a negative external clock /clk_ext, and a reference clock clk_ref are shown. A clock buffer receives the positive external clock clk_ext and the negative external clock /clk_ext so as to generate the reference clock clk_ref that has the same phase as a phase of the positive external clock clk_ext. Substantially, there is a difference in amplitude between the positive external clock clk_ext and the reference clock clk_ref, but the difference is not shown in FIG. 1.

As shown in FIG. 1, a level of a DLL power supply voltage Vdll that is used as a power supply for the DLL circuit may be arbitrarily changed. Examples of factors causing the voltage level to be changed may include a voltage level change of an external power supply, a change in the amount of load that occurs due to an entrance to or exit from a power down mode, a change in temperature, or the like. If the level of the DLL power supply voltage Vdll is changed due to one of the factors, a ratio between a low-level period and a high-level period in the reference clock clk_ref output by the clock buffer is not exact "1:1". Here the ratio is called a duty ratio. This is because when the level of the DLL power supply voltage Vdll falls, the low-level period of the reference clock clk_ref increases, and when the level of the DLL power supply voltage Vdll rises, the high-level period of the reference clock clk_ref increases. In FIG. 1, a level change of the DLL power supply voltage Vdll is denoted by dV, and a change in phase of the reference clock clk_ref is denoted by dD.

As described above, when the duty ratio of the reference clock is variable, an operation of a phase comparator is not performed in a normal state. Due to an error of the duty ratio, an internal clock output through a delay line does not have a pre-set phase, and thus, reliability of the operation of the DLL circuit is reduced. As a result, the operation may cause the semiconductor integrated circuit having the DLL circuit therein not to operate. However, in the related art, there may be an erroneous operation of the DLL circuit because the duty ratio of the reference clock is variable.

SUMMARY OF THE INVENTION

Embodiments of the present invention provide an apparatus and method of generating a reference clock for a DLL circuit that generates a reference clock having a constant duty ratio even when a change in the amount of power supply occurs.

An embodiment of the present invention provides an apparatus for generating a reference clock for a DLL circuit including: a buffering unit configured to buffer an external clock so as to generate a first reference clock and a second reference clock, and to invert the second reference clock so as to generate a negative second reference clock; and a duty cycle compensating unit configured to generate a reference clock from the first reference clock and the negative second reference clock.

Another embodiment of the present invention provides an apparatus for generating a reference clock for a DLL circuit including: a first clock buffer configured to generate a first reference clock that has the same phase as a phase of a positive external clock; a second clock buffer configured to generate a second reference clock that has the same phase as a phase of a negative external clock; and a duty cycle compensating unit configured to mix the phase of an inverted clock of the second reference clock and the phase of the first reference clock so as to generate a reference clock.

Still another embodiment of the present invention provides a method of generating a reference clock for a DLL circuit including: buffering an external clock so as to generate a first reference clock and a second reference clock; inverting the second reference clock so as to generate a negative second reference clock; and mixing a phase of the first reference clock and a phase of the negative second reference clock so as to generate a reference clock.

DESCRIPTION OF EXEMPLARY EMBODIMENTS

Embodiments of the present invention will now be described in detail with reference to the accompanying drawings.

Figure 2:
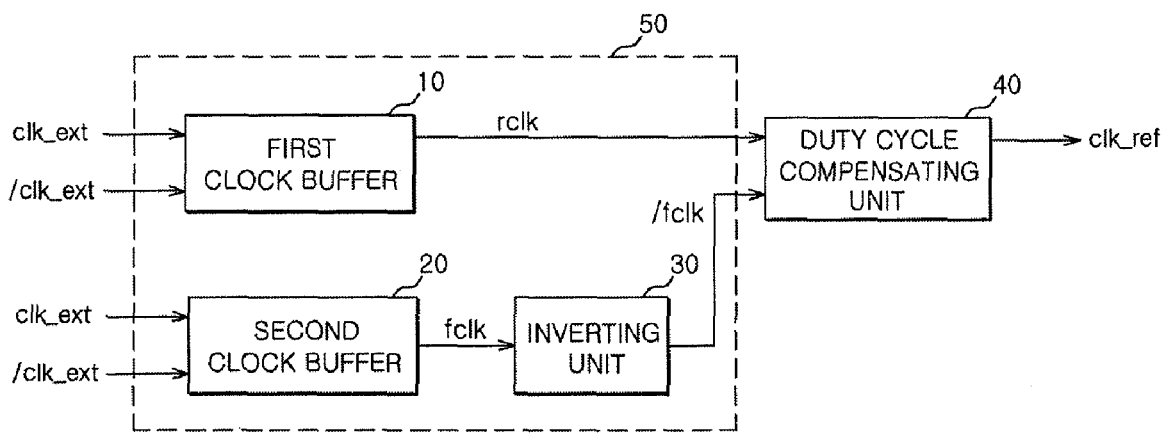
FIG. 2 is a diagram illustrating a structure of an apparatus for generating a reference clock for a DLL circuit according to an embodiment of the present invention.

Referring to FIG. 2, an apparatus for generating a reference clock for a DLL circuit according to an embodiment of the present invention includes a first clock buffer 10, a second clock buffer 20, an inverting unit 30, and a duty cycle compensating unit 40. The first clock buffer 10, the second clock buffer 20, and the inverting unit 30 may form a buffering unit 50.

The first clock buffer 10 buffers a positive external clock clk_ext and a negative external clock /clk_ext so as to generate a rising clock rclk. The rising clock rclk has the same phase as a phase of the positive external clock clk_ext.

The second clock buffer 20 buffers the positive external clock clk_ext and the negative external clock /clk_ext so as to generate a falling clock fclk. The falling clock fclk has the same phase as the negative external clock /clk_ext.

The first clock buffer 10 and the second clock buffer 20 have the same structure as each other. Since the first and second clock buffers 10 and 20 receive the positive external clock clk_ext and the negative external clock /clk_ext through different terminals thereof, the rising clock rclk and the falling clock fclk have phases opposite to each other. It can be stated that the rising clock rclk is a first reference clock and the falling clock fclk is a second reference clock that has an opposite phase to that of the first reference clock. The two clocks that are output by the first clock buffer 10 and the second clock buffer 20, respectively, have opposite phases to each other. Therefore, the two clocks are represented as the rising clock rclk and the falling clock fclk. The rising clock rclk and the falling clock fclk only indicate that they have the phases opposite to each other.

Figure 3:
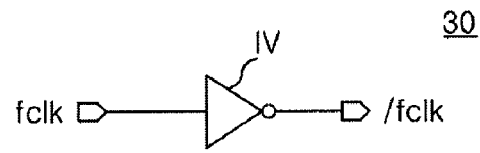
FIG. 3 is a diagram illustrating a structure of an inverting unit shown in FIG. 2.

The inverting unit 30 inverts the falling clock fclk so as to generate a negative falling clock /fclk. As shown in FIG. 3, the inverting unit 30 may be composed of an inverter IV. When the DLL power supply voltage Vdll maintains a predetermined level, the negative falling clock /fclk output by the inverting unit 30 becomes a clock that has the same phase as a phase of the rising clock rclk.

The duty cycle compensating unit 40 compensates duty cycles of the rising clock rclk and the negative falling clock /fclk so as to generate a reference clock clk_ref. The duty cycle compensating unit 40 generates a clock that has a rising edge corresponding to a middle point between rising edges of the two input clocks and a falling edge corresponding to a middle point between falling edges thereof during each cycle with the same timing as the two input clocks. When the DLL power supply voltage Vdll maintains the predetermined level, since the negative falling clock /fclk has the same phase as the rising clock rclk, the duty cycle compensating unit 40 generates and outputs the reference clock clk_ref that has the same phase as the phases of the two clocks.

Meanwhile, when the DLL power supply voltage Vdll does not maintain the predetermined level but falls, a low-level period of each of the rising clock rclk and the falling clock fclk increases, and a high-level period thereof decreases. The negative falling clock /fclk output by the inverting unit 30 becomes a clock that has a high-level period longer than a low-level period. Therefore, the rising clock rclk and the negative falling clock /fclk have different phases from each other. The duty cycle compensating unit 40 generates a clock that has a rising edge corresponding to a middle point between a rising edge of the rising clock rclk and a rising edge of the negative falling clock /fclk and a falling edge corresponding to a middle point between a falling edge of the rising clock rclk and a falling edges of the negative falling clock /fclk during each cycle with the same timing as the rising clock rclk and the negative falling clock /fclk, and outputs the clock as the reference clock clk_ref. Therefore, the reference clock clk_ref can serve as a clock that may not be affected by a change in level of the DLL power supply voltage Vdll.

Figure 4:
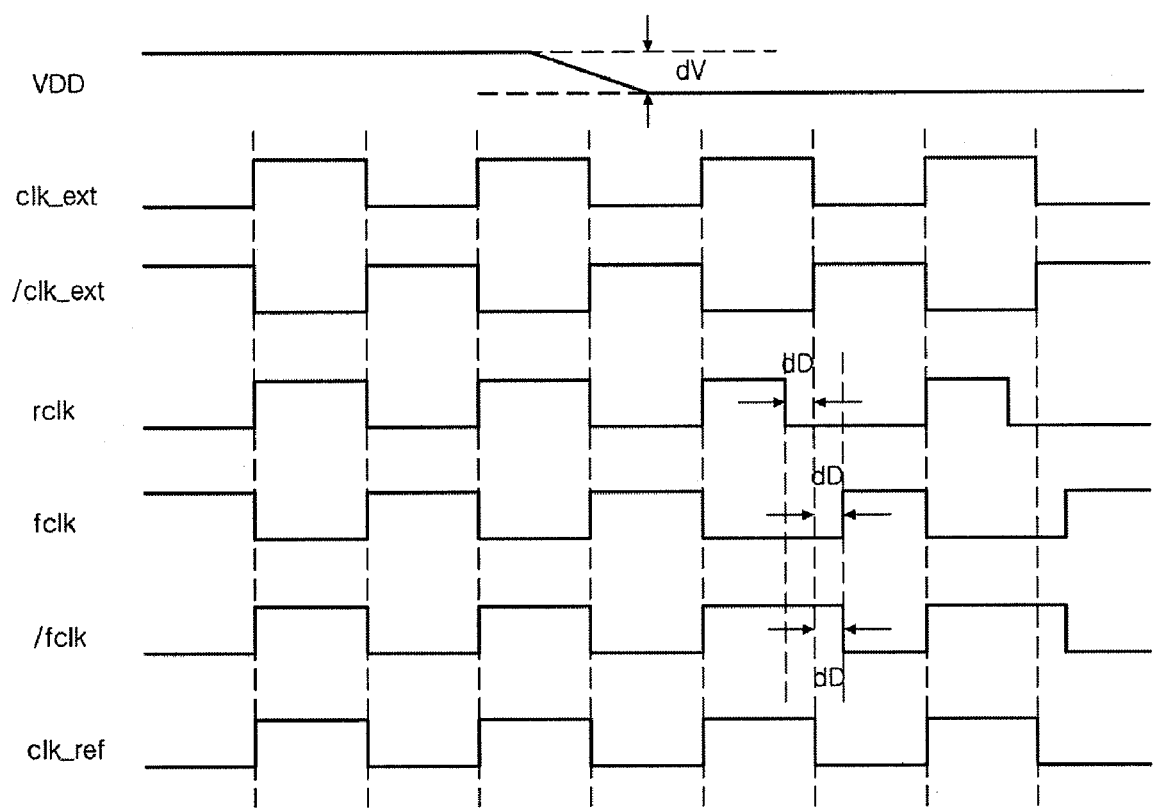
FIG. 4 is a timing diagram illustrating the operation of the apparatus for generating a reference clock for the DLL circuit according to an embodiment of the present invention.

FIG. 4 is a timing diagram illustrating the operation of the apparatus for generating a reference clock for the DLL circuit according to an embodiment of the present invention.

Figure 1:
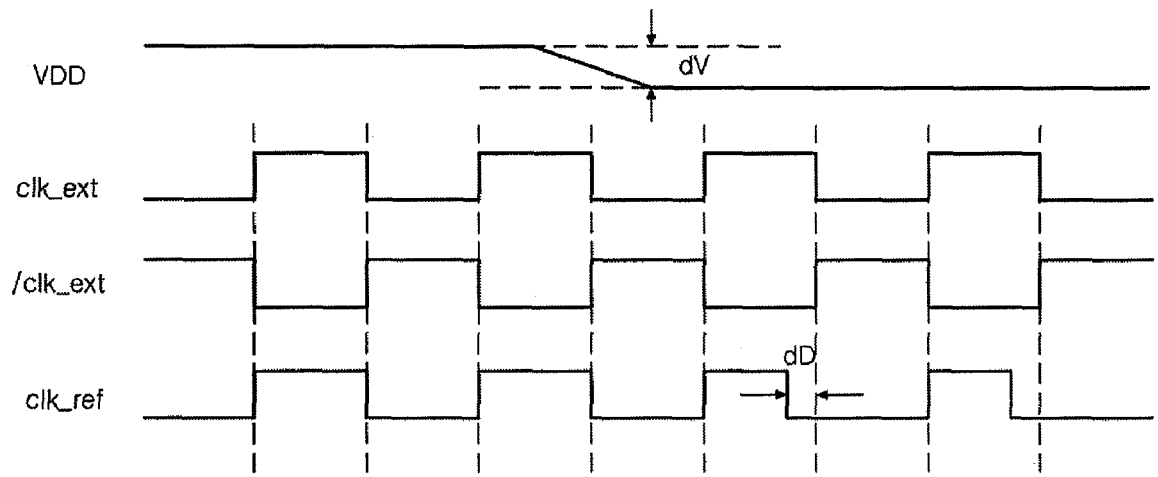
FIG. 1 is a timing diagram illustrating the operation of an apparatus for generating a reference clock for a DLL circuit according to the related art.

In FIG. 4, the positive external clock clk_ext, the negative external clock /clk_ext, the rising clock rclk, the falling clock fclk, the negative falling clock /fclk, and the reference clock clk_ref are shown. Like FIG. 1, there are differences in amplitude between the respective clocks, but these are not shown in FIG. 3. Further, a change in level of the DLL power supply voltage Vdll is denoted by dV and a change in phase of the reference clock clk_ref is denoted by dD.

As shown in FIG. 4, when a level of the DLL power supply voltage Vdll falls, a low-level period of each of the rising clock rclk and the falling clock fclk becomes longer than a high-level period thereof. As a result, the negative falling clock /fclk, which is an inversion signal of the falling clock fclk, becomes a clock that has a high-level period longer than a low-level period. The duty cycle compensating unit 40 generates the clock that has the rising edge corresponding to the middle point between the rising edges of the rising clock rclk and the negative falling clock /fclk and the falling edge corresponding to the middle point of the falling edges thereof during each cycle with the same timing as the rising clock rclk and the negative falling clock /fclk. Further, the duty cycle compensating unit 40 outputs the clock as the reference clock clk_ref. Therefore, the reference clock clk_ref and the positive external clock clk_ext have the same phase as each other. Further, it is possible to assume that the reference clock clk_ref and the positive clock clk_ext have the same phase as each other according to the same operation when the level of the DLL power supply voltage Vdll rises.

As described above, the apparatus for generating a reference clock for the DLL circuit according to an embodiment of the present invention generates the rising clock that has the same phase as the phase of the positive external clock and the falling clock that has the same phase as the phase of the negative external clock. The apparatus inverts the phase of the falling clock, and then mixes the phase of the rising clock and the inverted phase of the falling clock. Therefore, a reference clock that has a stable duty ratio is generated even when a change in the amount of the DLL power supply voltage occurs. As such, when the reference clock having the stable duty ratio is generated, reliability of the DLL circuit is improved, and an erroneous operation of the semiconductor integrated circuit having the DLL circuit therein is decreased.

It will be apparent to those skilled in the art that various modifications and changes may be made without departing from the scope and spirit of the present invention. Therefore, it should be understood that the above embodiments are not limitative, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

As described above, the apparatus and method of generating a reference clock for the DLL circuit according to an embodiment of the present invention generates a reference clock having a constant duty ratio even when a change in the amount of power supply occurs by generating two clocks from an external clock and controlling phases of the two clocks so as to generate the reference clock.

Further, the apparatus and method of generating a reference clock for the DLL circuit according to an embodiment of the present invention supports a stable data output operation of the semiconductor integrated circuit by generating a reference clock having a constant duty ratio.

What is claimed is:

1. An apparatus for generating a reference clock for a DLL circuit, the apparatus comprising:
   a buffering unit configured to buffer a positive external clock and a negative external clock to generate a first reference clock and a second reference clock independent to each other, to invert the second reference clock to generate a negative second reference clock, and to output the first reference clock and the negative second reference clock independent to each other; and
   a duty cycle compensating unit configured to receive the first reference clock and the negative second reference clock and mix the first reference clock and the negative second reference clock to generate a reference clock,
   wherein the buffering unit is configured to receive the positive external clock and the negative external clock and output the first reference clock that has a same phase as a phase of the positive external clock, and receive the positive external clock and the negative external clock and output the second reference clock that has a same phase as a phase of the negative external clock.

2. The apparatus of claim 1,
   wherein the buffering unit comprises:
   a first clock buffer configured to buffer the positive external clock and the negative external clock to generate the first reference clock;
   a second clock buffer configured to buffer the positive external clock and the negative external clock to generate the second reference clock; and
   an inverting unit configured to invert the second reference clock to generate the negative second reference clock.

3. The apparatus of claim 2,
   wherein the first clock buffer and the second clock buffer output the first reference clock and the second reference clock, respectively, which have opposite phases to each other.

4. The apparatus of claim 2,
   wherein the inverting unit comprises an inverter.

5. The apparatus of claim 1,
   wherein the reference clock has a rising edge at a middle point between a rising edge of the first reference clock and a rising edge of the negative second reference clock and a falling edge at a middle point between a falling edge of the first reference clock and a falling edge of the negative second reference clock during each cycle with a same timing as the first reference clock and the second reference clock.

6. An apparatus for generating a reference clock for a DLL circuit, the apparatus comprising:
   a first clock buffer configured to receive a positive external clock and a negative external clock and output a first reference clock that has a same phase as a phase of the positive external clock;
   a second clock buffer configured to receive the positive external clock and the negative external clock and output a second reference clock that has a same phase as a phase of the negative external clock; and
   a duty cycle compensating unit configured to receive the first reference clock and an inverted clock of the second reference clock and to mix a phase of the inverted clock of the second reference clock and the phase of the first reference clock so as to generate a reference clock.

7. The apparatus of claim 6,
   wherein the reference clock has a rising edge at a middle point between a rising edge of the first reference clock and a rising edge of the inverted clock of the second reference clock and a falling edge at a middle point between a falling edge of the first reference clock and a falling edge of the inverted clock of the second reference clock during each cycle with a same timing as the first reference clock and the second reference clock.

8. A method of generating a reference clock for a DLL circuit, the method comprising:
   receiving a positive external clock and a negative external clock;
   outputting a first reference clock that has a same phase as a phase of the positive external clock and a second reference clock that has a same phase as a phase of the negative external clock;
   inverting the second reference clock to generate and output a negative second reference clock; and
   receiving the first reference clock and the negative second reference clock and mixing a phase of the first reference clock and a phase of the negative second reference clock to generate a reference clock, wherein the first reference clock and the second reference clock are generated at the same time independent to each other.

9. The method of claim 8,
   wherein the first reference clock and the second reference clock have phases opposite to each other.

10. The method of claim 8,
   wherein the reference clock has a rising edge at a middle point between a rising edge of the first reference clock and a rising edge of the negative second reference clock and a falling edge at a middle point between a falling edge of the first reference clock and a falling edge of the negative second reference clock during each cycle with a same timing as the first reference clock and the second reference clock.

* * * * *